United States Patent
Basu et al.

(10) Patent No.: US 9,484,463 B2
(45) Date of Patent: Nov. 1, 2016

(54) FABRICATION PROCESS FOR MITIGATING EXTERNAL RESISTANCE OF A MULTIGATE DEVICE

(71) Applicant: International Business Machines Corporation, Armonk, NY (US)

(72) Inventors: Anirban Basu, Elmsford, NY (US); Guy Cohen, Mohegan Lake, NY (US); Amlan Majumdar, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 14/197,655

(22) Filed: Mar. 5, 2014

(65) Prior Publication Data

US 2015/0255567 A1 Sep. 10, 2015

(51) Int. Cl.
| | |
|---|---|
| *H01L 29/78* | (2006.01) |
| *H01L 29/205* | (2006.01) |
| *H01L 29/66* | (2006.01) |
| *H01L 29/201* | (2006.01) |
| *H01L 29/778* | (2006.01) |

(52) U.S. Cl.
CPC ......... *H01L 29/7851* (2013.01); *H01L 29/201* (2013.01); *H01L 29/205* (2013.01); *H01L 29/66795* (2013.01); *H01L 29/7784* (2013.01); *H01L 29/785* (2013.01)

(58) Field of Classification Search
CPC ................................................ H01L 29/66795
See application file for complete search history.

(56) References Cited

U.S. PATENT DOCUMENTS

| 4,745,446 A | 5/1988 | Cheng et al. |
|---|---|---|
| 6,924,516 B2 | 8/2005 | Inoue et al. |
| 7,037,795 B1 | 5/2006 | Barr et al. |
| 7,187,045 B2 | 3/2007 | Braddock |
| 7,560,784 B2 | 7/2009 | Cheng et al. |
| 7,795,677 B2 | 9/2010 | Bangsaruntip et al. |
| 8,169,024 B2 | 5/2012 | Cheng et al. |
| 8,183,627 B2 | 5/2012 | Currie |
| 8,183,646 B2 | 5/2012 | Chau et al. |
| 9,136,357 B1* | 9/2015 | Basu ................... H01L 29/6681 |
| 2011/0024794 A1 | 2/2011 | Ko et al. |
| 2012/0256238 A1 | 10/2012 | Ning et al. |

OTHER PUBLICATIONS

Terao et al., "InP/InGaAs Composite Metal-Oxide-Semiconductor Field-Effect Transistors with Regrown Source and Al2O3 Gate Dielectric Exhibiting Maximum Drain Current Exceeding 1.3A/mum" Published in Journal: Applied Physics Express, vol. 4, No. 5, pp. 054201 (3 pp.) Presented at the Japan Society of Applied Physics through the Institute of Pure and Applied Physics in May 2011 pp. 054201-1-054201-3.

* cited by examiner

*Primary Examiner* — Mohammad Choudhry
(74) *Attorney, Agent, or Firm* — Louis Percello

(57) ABSTRACT

A method for fabricating a multigate device includes forming a fin on a substrate of the multigate device, the fin being formed of a semiconductor material, growing a first conformal epitaxial layer directly on the fin and substrate, wherein the first conformal epitaxial layer is highly doped, growing a second conformal epitaxial layer directly on the first conformal epitaxial layer, wherein the second conformal epitaxial layer is highly doped, selectively removing a portion of second epitaxial layer to expose a portion of the first conformal epitaxial layer, selectively removing a portion of the first conformal epitaxial layer to expose a portion of the fin and thereby form a trench, and forming a gate within the trench.

16 Claims, 8 Drawing Sheets

US 9,484,463 B2

FABRICATION PROCESS FOR MITIGATING EXTERNAL RESISTANCE OF A MULTIGATE DEVICE

FIELD OF THE DISCLOSURE

The present disclosure relates generally to multigate devices and relates more specifically to fabrication processes for lowering interface states of multigate devices.

BACKGROUND OF THE DISCLOSURE

A multigate device or multiple gate field effect transistor (MuGFET) is a metal-oxide-semiconductor field effect transistor (MOSFET) that incorporates more than one gate into a single device.

One particular type of multigate device is the finFET, which refers to a nonplanar, multi-gate transistor built on a silicon-on-insulator (SOI) substrate and based on the earlier DELTA (single-gate) transistor design. A distinguishing characteristic of the finFET is a conducting channel in a thin silicon "fin," which forms the body of the device.

Another type of multigate device is the tri-gate or three-dimensional (3D) transistor (not to be confused with a 3D microchip) fabrication used for the nonplanar transistor architecture used in certain processors (e.g., processors based on the 22 nanometer manufacturing process). Tri-gate transistors employ a single gate stacked on top of two vertical gates, creating additional surface area for carriers to travel.

The performance of finFET and tri-gate devices is severely limited by high external resistance ($R_{ext}$) and interface state density ($D_{it}$). $R_{ext}$ is difficult to solve in III-V types of finFET and tri-gate devices, owing to the difficulty in forming high-quality contacts due to limited thermal budget of processing. $D_{it}$ is also difficult to solve in III-V types of finFET and tri-gate devices, owing to a high concentration of interface states at the oxide/semiconductor interface.

SUMMARY OF THE DISCLOSURE

A method for fabricating a multigate device includes forming a fin on a substrate of the multigate device, the fin being formed of a semiconductor material, growing a first conformal epitaxial layer directly on the fin and substrate, wherein the first conformal epitaxial layer is highly doped, growing a second conformal epitaxial layer directly on the first conformal epitaxial layer, wherein the second conformal epitaxial layer is highly doped, selectively removing a portion of the second epitaxial layer to expose a portion of the first conformal epitaxial layer, selectively removing a portion of the first epitaxial layer to expose a portion of the fin and thereby form a trench, and forming a gate within the trench.

In another embodiment, a method for fabricating a multigate device includes forming a fin on a substrate of the multigate device, the fin comprising a III-V compound, growing a first conformal epitaxial layer comprising a first semiconductor material directly on the fin and substrate, wherein the first conformal epitaxial layer is highly doped, growing a second conformal epitaxial layer comprising a second semiconductor material directly on the first conformal epitaxial layer, wherein the second conformal epitaxial layer is highly doped and is approximately as thick as the first conformal epitaxial layer, selectively removing a portion of the second epitaxial layer to expose a portion of the first conformal epitaxial layer, selectively removing a portion of the first epitaxial layer to expose a portion of the fin and thereby form a trench, and forming a gate within the trench.

In another embodiment, a multigate device includes a fin formed on a substrate, the fin comprising a semiconductor material, a first conformal epitaxial layer grown directly on the fin and substrate, wherein the first conformal epitaxial layer is highly doped, a second conformal epitaxial layer grown directly on a portion of first conformal epitaxial layer, wherein the second conformal epitaxial layer is highly doped, a trench formed in the first conformal epitaxial layer and the second conformal epitaxial layer, and a gate formed within the trench.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the Figures.

DETAILED DESCRIPTION

In one embodiment, the present invention is a method and apparatus for fabricating a multigate device having a relatively low external resistance ($R_{ext}$). Embodiments of the invention grow two different conformal, highly doped epitaxial layers on the fins of a multigate device (e.g., a finFET or trigate device). Subsequent processing steps selectively remove the epitaxial layers from the device channel areas, but leave portions of the epitaxial layers in the source and drain regions of the device.

FIGS. 1A-1H, 2A-2G, and 3A-3H are schematic diagrams illustrating various steps for fabricating a multigate device 100, according to the present invention. In particular, FIGS. 1A-1H illustrate top views of the various steps for fabricating the multigate device 100, while FIGS. 2A-2G and 3A-3H illustrate cross sectional views corresponding to the top views illustrated in FIGS. 1A-1H. Collectively, FIGS. 1A-1H, 2A-2G, and 3A-3H serve as a flow diagram illustrating one embodiment of a fabrication process according to the present invention.

Figure 1A:
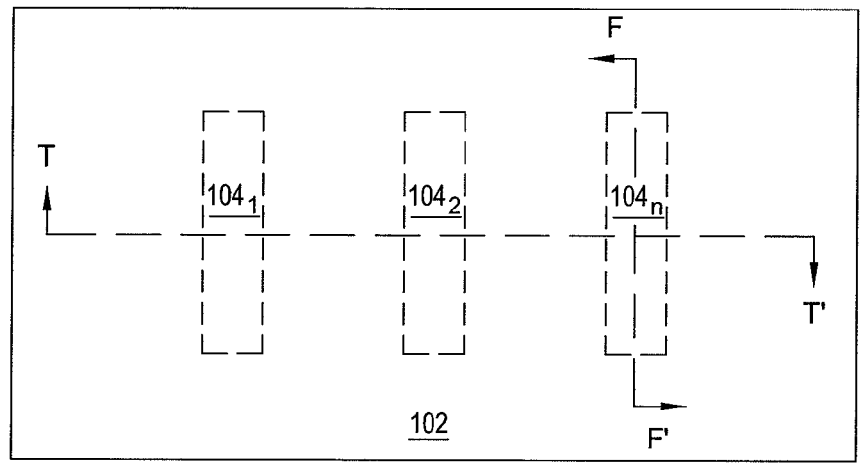
FIGS. 1A-1H illustrate top views of various steps for fabricating a multigate device.
Figure 2A:
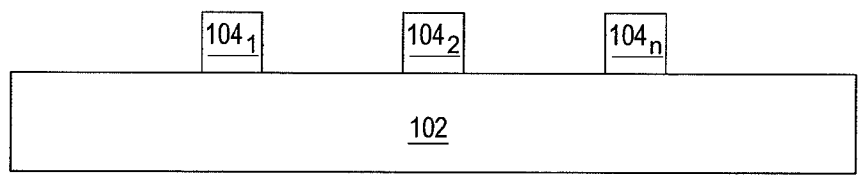
FIGS. 2A-2G illustrate cross sectional views corresponding to the top views illustrated in FIGS. 1A-1H.
Figure 3A:
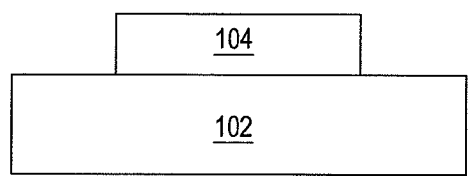
FIGS. 3A-3H illustrate cross sectional views corresponding to the top views illustrated in FIGS. 1A-1H.

As illustrated in FIGS. 1A, 2A, and 3A, the multigate device 100 includes a substrate 102 and a plurality of fins $104_1$-$104_n$ (hereinafter collectively referred to as "fins 104") deposited on the substrate 102. In one embodiment, the fins 104 comprise a semiconductor material (e.g., a III-V compound such as indium gallium arsenide or the like). The fins 104 are spaced apart from each other along the length of the substrate 102 and may be defined by reactive ion etching (RIE) or a similar process. In one embodiment, the substrate 102 is a semi-insulating semiconductor such as indium phosphide (SI InP). In another embodiment, the substrate 102 is merely used for support and has a surface layer made of an insulator such as silicon dioxide ($SiO_2$). A single-crystal layer of InGaAs, from which the fins 104 are patterned, may be formed over the $SiO_2$ layer by wafer bonding and layer transfer.

Figure 1B:
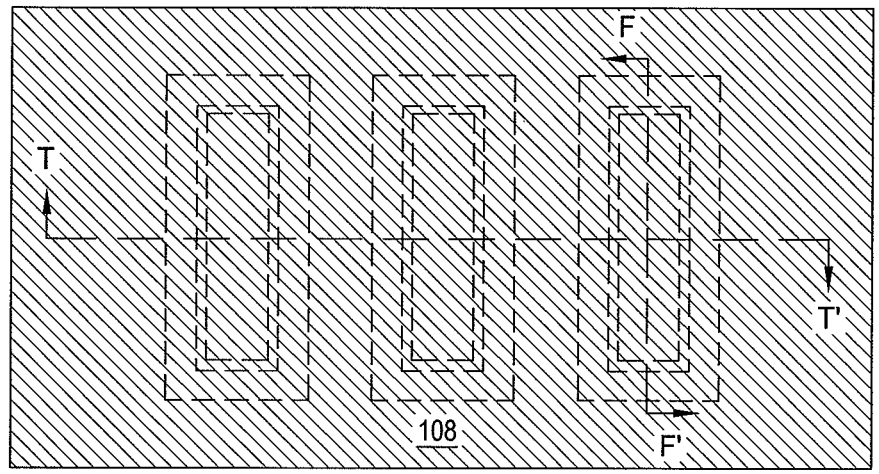
Figure 2B:
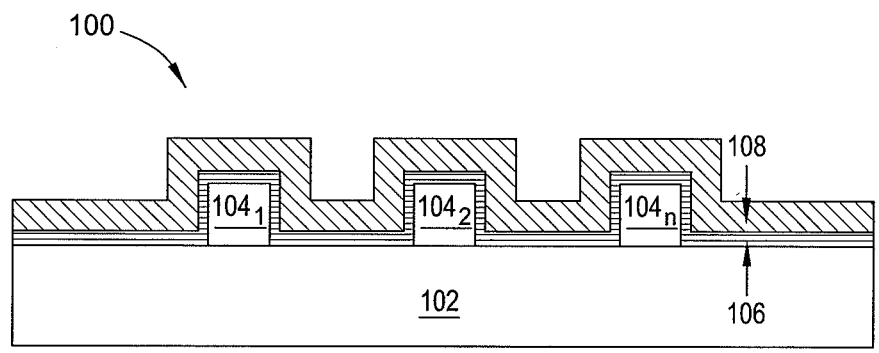
Figure 3B:
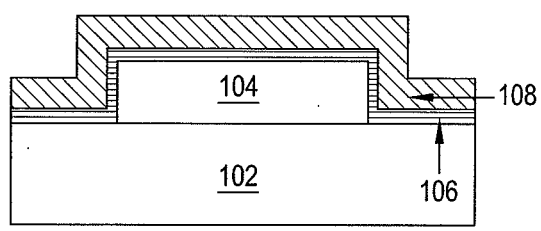

As illustrated in FIGS. 1B, 2B, and 3B two conformal epitaxial layers are grown on the multigate device 100. In one embodiment (e.g., where the substrate 102 comprises a single-crystal semiconductor), the first epitaxial layer 106 is grown directly on the substrate 102 and fins 104 and is highly doped (e.g., n doped). However, in an alternative embodiment (e.g., where the substrate 102 comprises an insulator top layer such as $SiO_2$), depending on the deposition method employed, the layer 106 will deposit only on exposed semiconductor surfaces and will not be deposited on the insulator top layer. Such selective deposition is typical of deposition methods such as metal-organic chemical vapor deposition (MOCVD) and metal-organic molecular beam epitaxy (MOMBE). The first epitaxial layer 106 comprises a semiconductor material (e.g., indium phosphide (InP), indium aluminum arsenide (InAlAs), or the like) and has a thickness of at least approximately twenty nanometers in one embodiment. The second epitaxial layer 108 is grown directly on the first epitaxial layer 106 and is also highly doped (e.g., n doped). In one embodiment, the second epitaxial layer 108 also comprises a semiconductor material, but the semiconductor material forming the second epitaxial layer 108 may be different from the semiconductor material forming the first epitaxial layer 106 (e.g., if the first epitaxial layer 106 is formed from indium phosphide, the second epitaxial layer 108 may be formed of indium gallium arsenide or the like). In one embodiment, the second epitaxial layer 108 also has a thickness of approximately twenty nanometers. In one embodiment, the specific materials from which the first epitaxial layer 106 and second epitaxial layer 108 are formed are chosen based on the material from which the fins 104 are formed. The first epitaxial layer 106 and the second epitaxial layer 108 are highly doped (e.g., n doped with doping density exceeding $10^{19}$ $cm^{-3}$). In the embodiment in which the fins 104 are formed over a surface layer of an insulator (such as $SiO_2$), the first epitaxial layer 106 and the second epitaxial layer 108 are formed only over the fins 104; no deposition of these layers occurs on the top surface of the substrate 102. As discussed above, such selective deposition (i.e., where the semiconductor material epitaxially deposits over only the semiconductor surfaces, but not over the insulator surfaces) is typical of MOCVD and MOMBE processes, for instance.

Figure 1C:
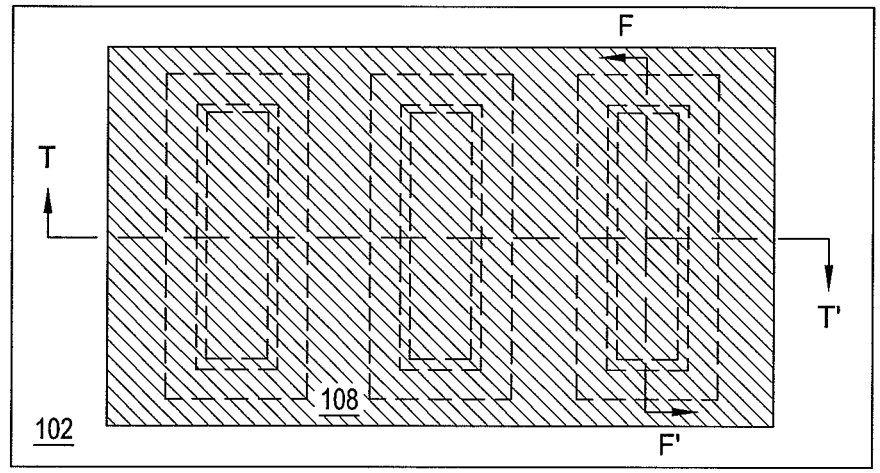
Figure 2C:
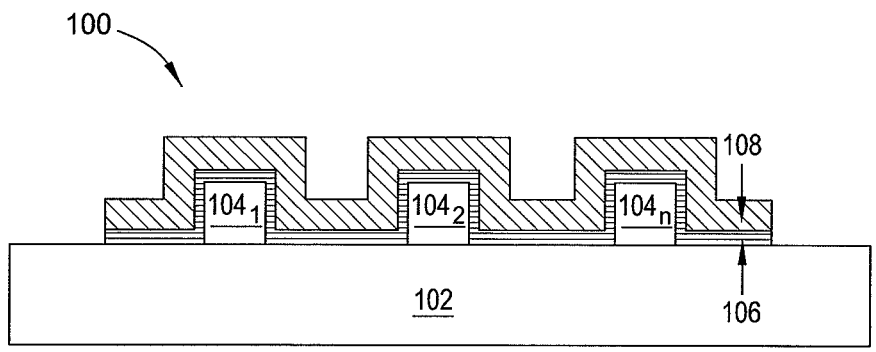
Figure 3C:
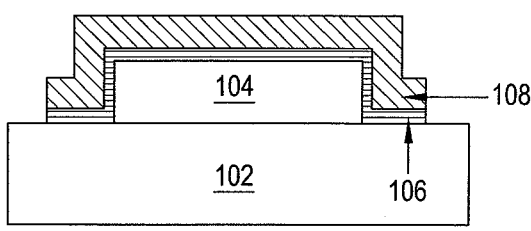

As illustrated in FIGS. 1C, 2C and 3C, the multigate device 100 is isolated from adjacent devices (not shown in FIGS. 1C, 2C, and 3C) by mesa isolation. This involves photolithography to cover region 108 with photoresist and removal of the second epitaxial layer 108 and the first epitaxial layer 106 to expose the substrate 102 in regions not covered by photoresist.

Figure 1D:
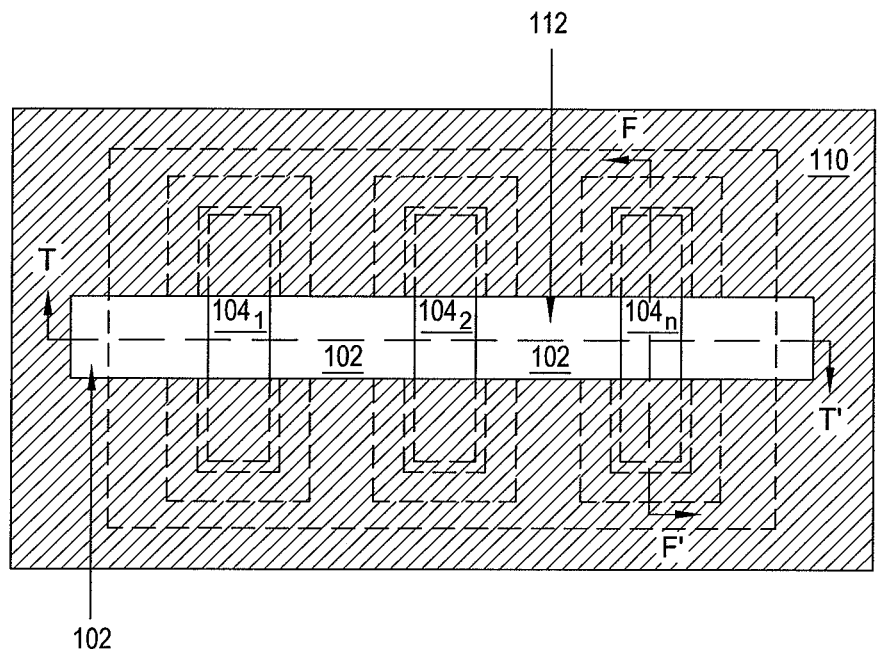
Figure 2D:
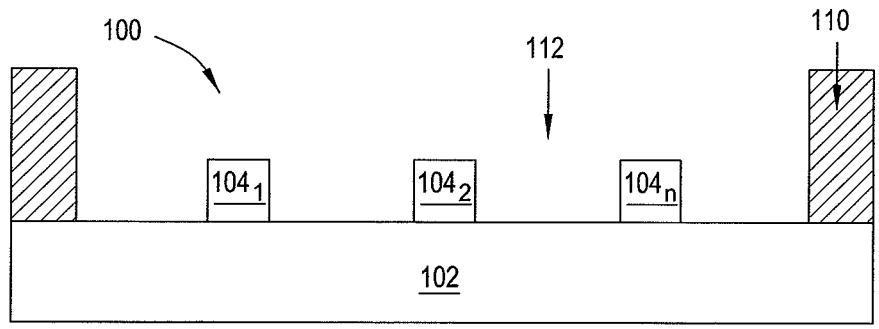
Figure 3D:
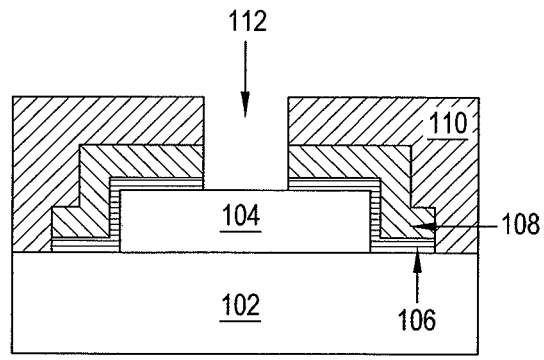

As illustrated in FIGS. 1D, 2D, and 3D, an insulator layer 110 is next deposited on the multigate device 100, directly over the second epitaxial layer 108 and the substrate 102. The insulator layer 110 may comprise silicon dioxide, silicon nitride, aluminum oxide ($Al_2O_3$), or the like. The insulator layer 110 may be further planarized, for example using a process such as chemical mechanical polishing (CMP). A trench 112 is then opened in the insulator layer 110. The trench 112 removes portions of the first epitaxial layer 106 and the second epitaxial layer 108 and exposes portions of the fins 104 and the substrate 102. In one embodiment, the trench 112 is formed along approximately a center axis (T-T' in FIG. 2C) of the multigate device 100 and extends from one end of the multigate device 100 to the other end of the multigate device 100.

Figure 1E:
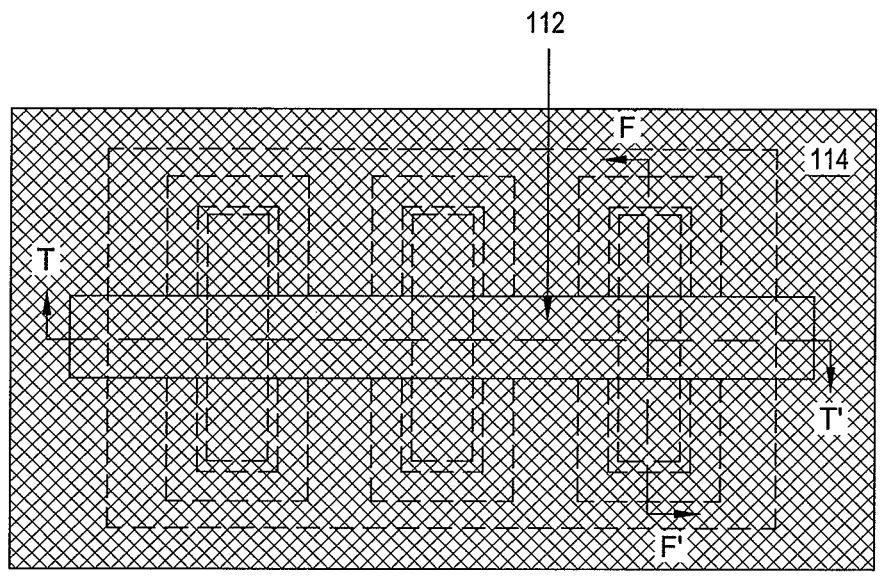
Figure 2E:
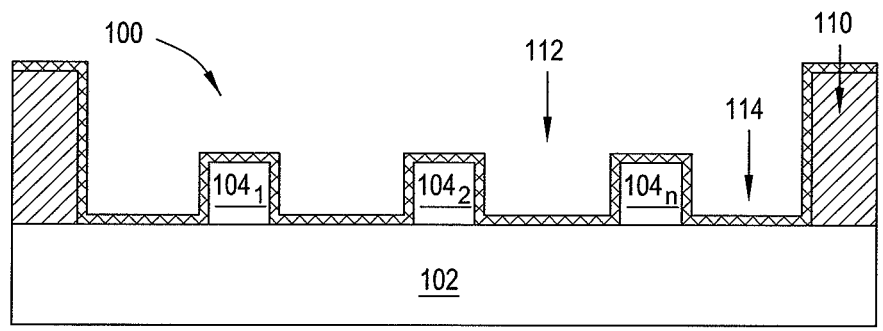
Figure 3E:
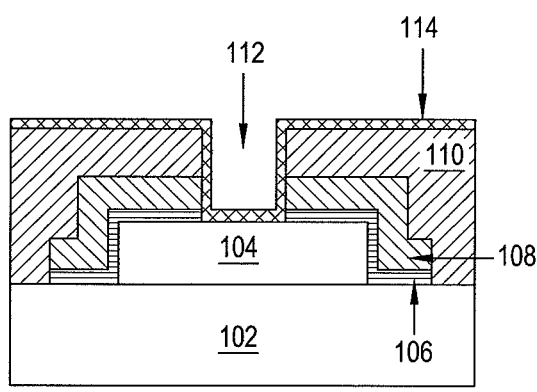

As illustrated in FIGS. 1E, 2E and 3E, a dielectric layer 114 is next deposited on the multigate device 100. Therefore, the dielectric layer 114 is deposited inside the trench 112 and atop the insulator layer 110. Inside the trench 112, the dielectric layer 114 is deposited on the fins 104 and the substrate 102. The dielectric layer 114 forms the gate dielectric on the fins 104 of the multigate device 100. The dielectric layer 114 may comprise a high-k dielectric such as hafnium oxide ($HfO_2$), aluminum oxide ($Al_2O_3$), or the like. In one embodiment, a large bandgap material that is epitaxially deposited over the first epitaxial layer 106 may substitute for the dielectric layer 114. For instance, where the substrate 102 and fins 104 are lattice matched to InP, a large bandgap material such as zinc cadmium selenide (ZnCdSe) or zinc cadmium magnesium selenide ($Zn_x$-$Cd_yMg_{1-x-y}Se$) may be used.

Figure 1F:
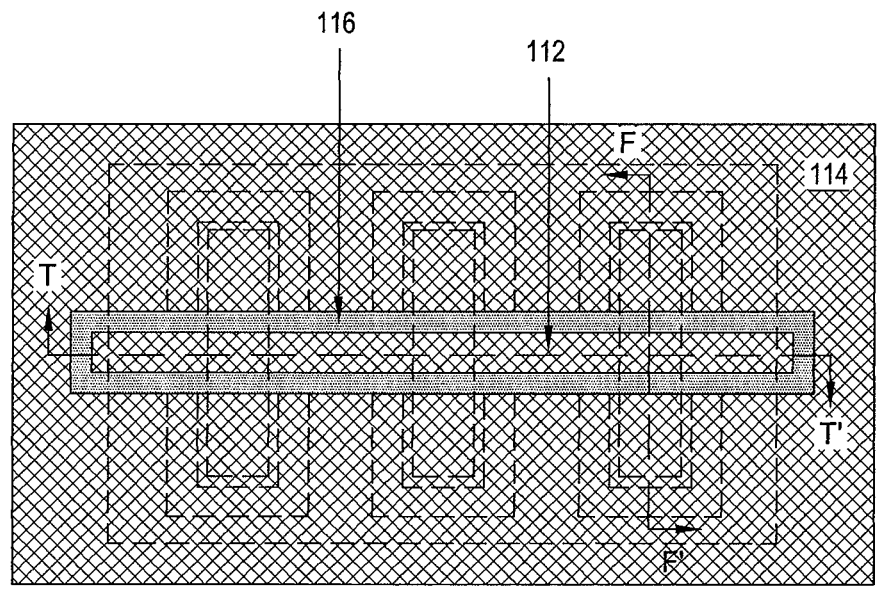
Figure 2F:
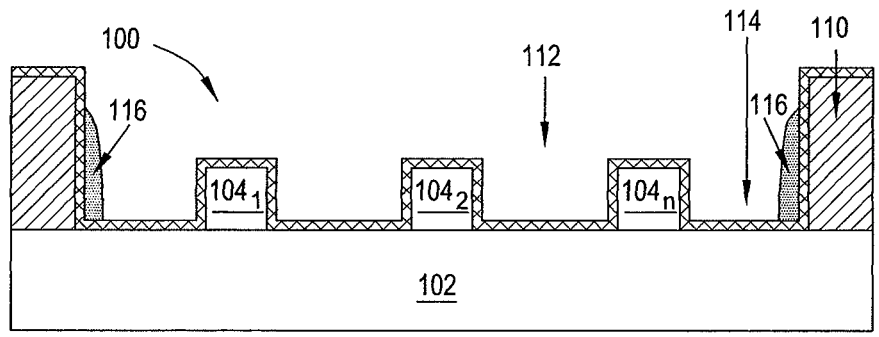
Figure 3F:
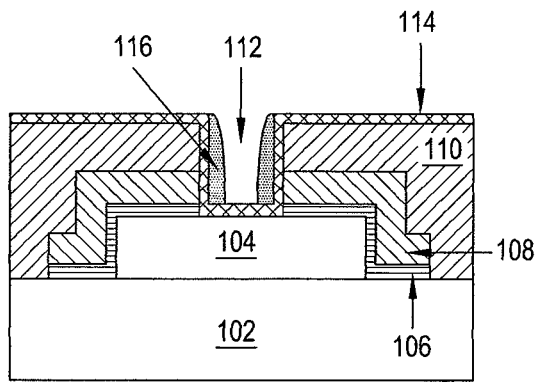

As illustrated in FIGS. 1F, 2F, and 3F, a nitride (e.g., silicon nitride) is next deposited in the trench 112 to form a plurality of spacers 116. In particular, the nitride is deposited over the surfaces of the fins 104 that are encapsulated with the first epitaxial layer 106 and over the insulator layer 110. Some of the nitride is next removed from the sidewalls of the fins 104. The nitride may be removed using an etch process, such as reactive ion etching. Residual nitride is left on the walls of the trench 112, taking caution to ensure that the height of the insulator layer 110 remains greater than the height of the fins 104. The gate will be self-aligned within the trench 112 as discussed in greater detail below. The need for the spacers 116 will become clear below.

Figure 1G:
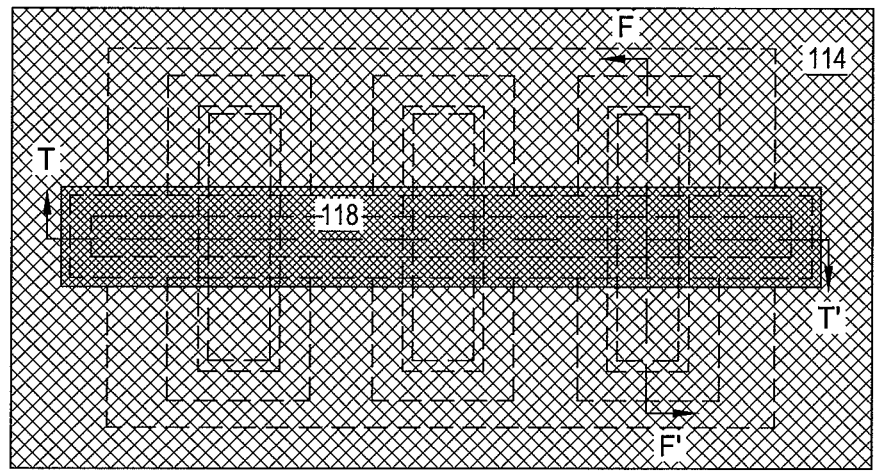
Figure 2G:
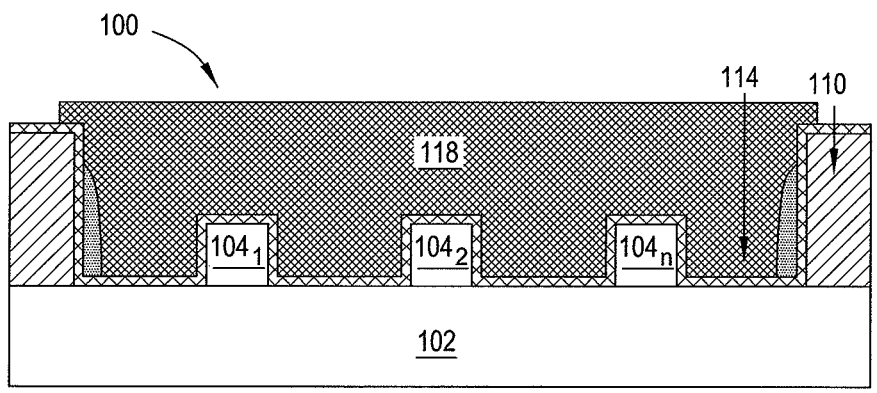
Figure 3G:
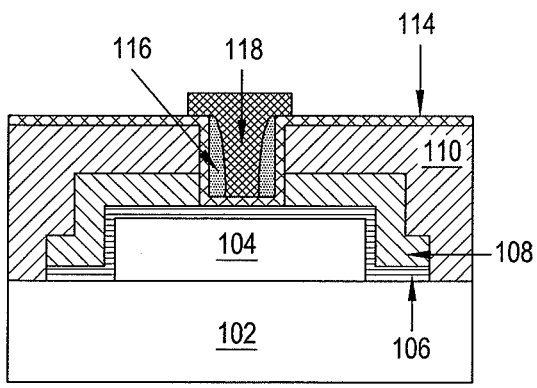

As illustrated in FIGS. 1G, 2G, and 3G, a metal gate 118 is then formed on the multigate device 100 (e.g., directly on the dielectric layer 114), including within the trench 112. In one embodiment, the metal gate 118 can be formed by one of three methods: (1) depositing a gate metal layer, patterning the shape of the metal gate 118 using photolithography (wherein the shape of the metal gate 118 is covered by photoresist), and then etching the gate metal from areas not covered by photoresist (this would typically result in a "T"-shaped gate); (2) patterning the shape of the metal gate 118 using photolithography (wherein the shape of the metal gate 118 is a window in photoresist), depositing a gate metal layer, and then lifting off the gate metal from areas covered by photoresist; or (3) depositing a gate metal layer, and using chemical mechanical polishing (CMP) to removed the excess gate material outside the trench 112 (this would be helpful when a tight gate pitch is needed, since the metal gate 118 is made self-aligned to the trench 112). As illustrated in FIG. 3G, the metal gate 118 is separated from the heavily-doped first epitaxial layer 106 and the heavily-doped second epitaxial layer 108 by the gate dielectric 114 and the spacers 116. Thus, the spacers 116 reduce the overlap capacitance between the metal gate 118 and the heavily-doped first and second epitaxial layers 106 and 108, which leads to improved high-speed device performance.

Figure 1H:
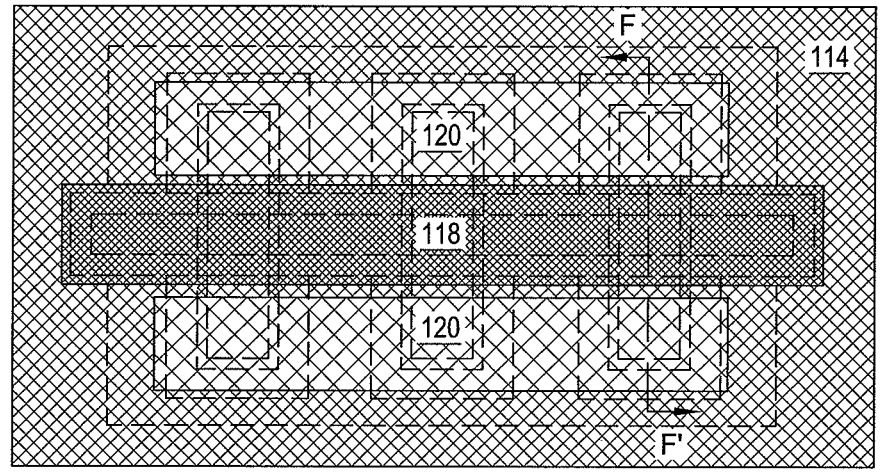
Figure 3H:
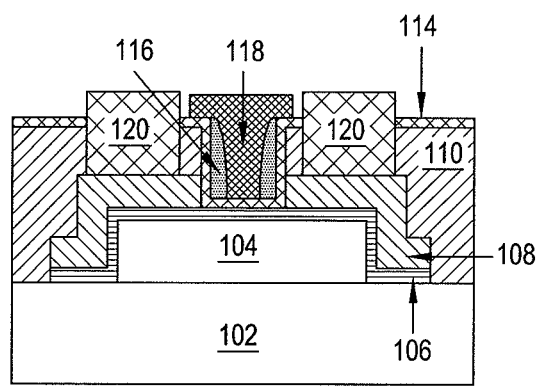

As illustrated in FIGS. 1H and 3H, source and drain (S/D) contacts 120 are next formed on the highly doped epitaxial regions of the multigate device 100. In one embodiment, the S/D contacts 120 are formed by patterning the shape of the S/D contacts 120 using photolithography (wherein the shape of the S/D contacts 120 is a window in photoresist), etching the dielectric layer 114 and the insulator layer 110 to expose the heavily-doped second epitaxial layer 108, depositing a S/D metal layer, and then lifting off the S/D metal from areas covered by photoresist. In another embodiment, source and drain (S/D) contacts 120 are made by first depositing a blanket dielectric layer (not illustrated) over the wafer, making an opening in the blanket dielectric layer and the insulator layer 110 to expose the second epitaxial layer 108, depositing a contact metal 120 over the wafer, and using CMP to remove the excess metal over the blanket dielectric layer.

The steps illustrated in 1A-1H, 2A-2G, and 3A-3H result in a conformal, highly doped epitaxial growth on the fins 104 of the multigate device 100. This lowers the contact resistance of the multigate device. Thus, the disclosed fabrication process, including the deposition and selective removal of two epitaxial layers, lowers the external resistance of multigate devices with minimal processing complexity.

Although various embodiments which incorporate the teachings of the present invention have been shown and described in detail herein, those skilled in the art can readily devise many other varied embodiments that still incorporate these teachings.

What is claimed is:

1. A method for fabricating a multigate device, the method comprising:
    forming a fin on a substrate of the multigate device, the fin comprising a semiconductor material;
    growing a first conformal epitaxial layer directly on the fin and substrate, wherein the first conformal epitaxial layer is highly doped;
    growing a second conformal epitaxial layer directly on the first conformal epitaxial layer, wherein the second conformal epitaxial layer is highly doped;
    selectively removing a portion of second epitaxial layer to expose a portion of the first conformal epitaxial layer;
    selectively removing a portion of the first conformal epitaxial layer to expose a portion of the fin and thereby form a trench; and
    forming a gate within the trench.

2. The method of claim 1, wherein the semiconductor material is a III-V compound.

3. The method of claim 2, wherein the III-V compound is indium gallium arsenide.

4. The method of claim 1, wherein the first conformal epitaxial layer has a thickness of at least approximately twenty nanometers.

5. The method of claim 1, wherein the first conformal epitaxial layer comprises indium phosphide.

6. The method of claim 1, wherein the second conformal epitaxial layer has a thickness of at least approximately twenty nanometers.

7. The method of claim 1, wherein the second conformal epitaxial layer comprises indium gallium arsenide.

8. The method of claim 1, further comprising:
    depositing an insulator layer directly on the second conformal epitaxial layer, prior to the selectively removing the portion of the second conformal epitaxial layer and the selectively removing the portion of the first conformal epitaxial layer, wherein at least a portion of the insulator layer is removed with the portion of the second conformal epitaxial layer and the portion of the first conformal epitaxial layer.

9. The method of claim 1, wherein the trench is formed along approximately a center axis of the multigate device and extends from a first end of the multigate device to a second end of the multigate device.

10. The method of claim 1, wherein the forming a gate comprises:
    depositing a dielectric layer on the multigate device;
    forming a dielectric spacer within the trench;
    depositing a gate metal layer directly on the dielectric layer and the dielectric spacer, including within the trench; and
    forming a source contact and a drain contact directly on the portion of the second conformal epitaxial layer.

11. A method for fabricating a multigate device, the method comprising:
    forming a fin on a substrate of the multigate device, the fin comprising a III-V compound;
    growing a first conformal epitaxial layer comprising a first semiconductor material directly on the fin and substrate, wherein the first conformal epitaxial layer is highly doped;
    growing a second conformal epitaxial layer comprising a second semiconductor material directly on the first conformal epitaxial layer, wherein the second conformal epitaxial layer is highly doped and is approximately as thick as the first conformal epitaxial layer;
    selectively removing a portion of second epitaxial layer to expose a portion of the first conformal epitaxial layer;
    selectively removing a portion of the first conformal epitaxial layer to expose a portion of the fin and thereby form a trench and thereby form a trench; and
    forming a gate within the trench.

12. The method of claim 11, wherein the III-V compound comprises indium gallium arsenide.

13. The method of claim 11, wherein the first semiconductor material comprises indium phosphide.

14. The method of claim 11, wherein the second semiconductor material comprises indium gallium arsenide.

15. The method of claim 11, wherein the first conformal epitaxial layer and the second conformal epitaxial layer are at least approximately twenty nanometers thick.

16. The method of claim 11, wherein the trench is formed along approximately a center axis of the multigate device and extends from a first end of the multigate device to a second end of the multigate device.

* * * * *